United States Patent
Borkar et al.

(12)

(10) Patent No.: US 6,437,601 B1
(45) Date of Patent: Aug. 20, 2002

(54) USING A TIMING STROBE FOR SYNCHRONIZATION AND VALIDATION IN A DIGITAL LOGIC DEVICE

(75) Inventors: Shekhar Y. Borkar; Matthew B. Haycock; Stephen R. Mooney, all of Beaverton; Aaron K. Martin, Hillsboro; Joseph T. Kennedy, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/752,906

(22) Filed: Dec. 26, 2000

(51) Int. Cl.[7] ............................................. H03K 19/096

(52) U.S. Cl. ................................ 326/93; 326/9; 326/21

(58) Field of Search ............................ 326/8, 9, 21, 31, 326/93, 94; 327/141

(56) References Cited

U.S. PATENT DOCUMENTS

| 5,452,323 A | * | 9/1995 | Rosen ......................... 375/354 |
| 5,578,946 A | * | 11/1996 | Cargerry et al. .............. 326/93 |
| 5,857,005 A | * | 1/1999 | Buckenmair ................. 375/357 |

* cited by examiner

Primary Examiner—Michael Tokar
Assistant Examiner—Anh Q. Tran
(74) Attorney, Agent, or Firm—Blakely, Sokoloff, Taylor & Zafman LLP

(57) ABSTRACT

In an electronic system having first and second logic devices, a free running on-chip clock signal is generated by the first logic device, where the signal has a frequency that is controlled to match that of a global free-running clock signal received by both devices. The on-chip clock signal is synchronized to a strobe signal received by the first device and that was transmitted in association with a data signal by the second device. A logic function is repeatedly performed as synchronized by the first clock signal, to repeatedly generate one or more bits from the data signal.

22 Claims, 11 Drawing Sheets

USING A TIMING STROBE FOR SYNCHRONIZATION AND VALIDATION IN A DIGITAL LOGIC DEVICE

This application is related to U.S. patent application entitled, "Data and Strobe Repeater Having a Frequency Control Unit to Re-time the Data and Reject Delay Variation in the Strobe" of Borkar et al., filed on the same date as this application and assigned to the same assignee.

BACKGROUND

This invention is generally related to clock synchronization in digital electronic systems, and more particularly to the use of timing strobes for synchronizing an on-chip clock and validating the application of the clock.

When communicating data, such as digital memory content, memory addresses, and/or control bits, from one device to several others in a digital logic system, it is necessary to insure that each receiver device captures the actual data that has been transmitted. This is very difficult to guarantee, particularly in high speed systems that process and transmit at several hundred megabits per second or higher, because of delays and other impairments to which a signal that carries the data is subjected while it is traveling between the transmitter and the receiver on a printed wiring board.

What has been conventionally done to alleviate this problem is to attempt to synchronize the transmitter and the receivers. Ideally, when synchronized, the transmitter and the receivers would process, generate, and capture data at a constant frequency defined by a free-running periodic clock signal that has been distributed to them. However, in practice, the devices must be designed to tolerate some unavoidable variation in the frequency that is derived by each device from the received clock signal. This variation, known as cycle to cycle jitter, may be caused by a number of factors, such as transmission line effects on the printed wiring board. The jitter becomes much more difficult to tolerate by the system as the clock frequency, and hence the performance of the system, increases. In some high performance systems, it may be expected that the clock jitter simply cannot be tolerated, such that the only solution would be to reduce the clock frequency.

BRIEF DESCRIPTION OF THE DRAWINGS

The invention is illustrated by way of example and not by way of limitation in the figures of the accompanying drawings in which like references indicate similar elements. It should be noted that references to "an" embodiment in this disclosure are not necessarily to the same embodiment, and they mean at least one.

DETAILED DESCRIPTION

According to an embodiment of the invention, a timing strobe, also referred to here as a source synchronous strobe, is provided for synchronization and validation in a digital logic device, to allow the device to be more immune to the jitter in a global free running clock signal. The strobe is not only used to synchronize an internal clock of the device, but also to validate the capture of input data or internal generation of data by the logic device. When data is being sent between devices, the timing strobe is also generated in sync with the data being transmitted. To maintain the timing accuracy of the strobe as it is received by a device, the physical characteristics of the link (be it on a chip, a printed wiring board, or other) including the distance between devices, is selected so as to minimize any deleterious transmission line effects on the strobe. For instance, the conductor line that carries the strobe between the transmitter and receiver may be shielded and minimized, to the extent possible given the layout of the IC die or printed wiring board of the system and the fabrication process. There may also be other considerations to ensure the accurate timing of the strobe.

Figure 1:
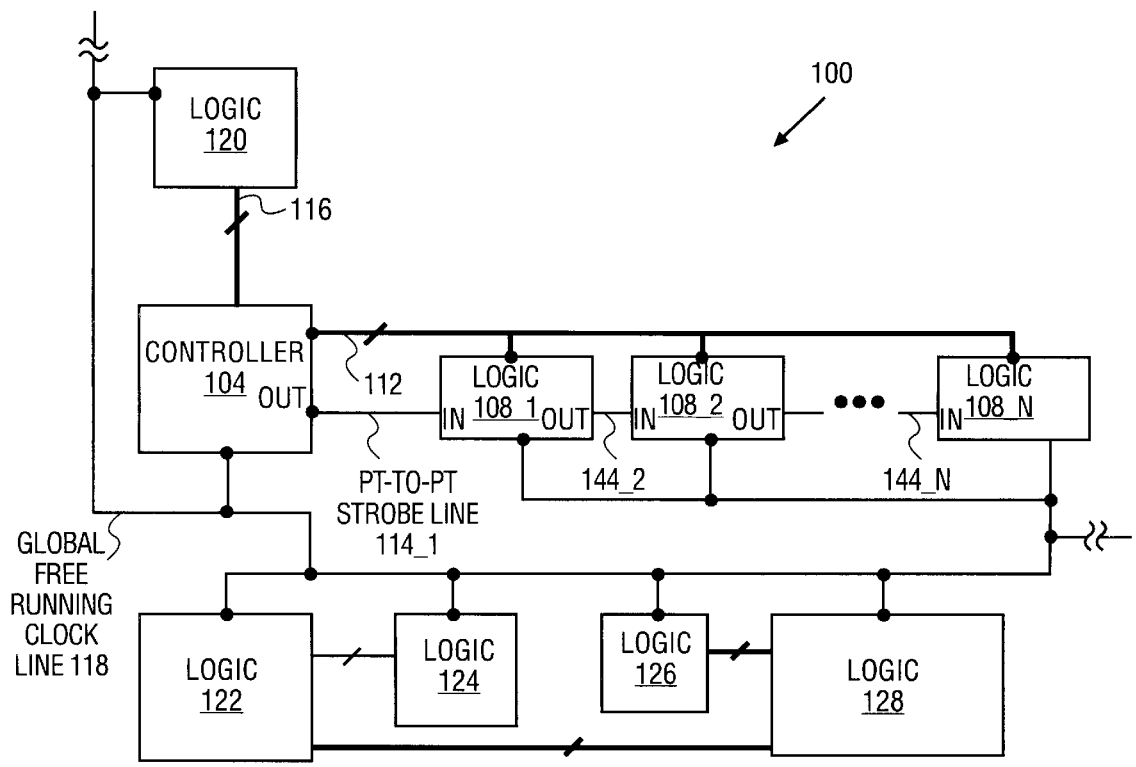
FIG. 1 shows a block diagram of an electronic system according to an embodiment of the invention.

Turning now to FIG. 1, an electronic system 100 is shown in block diagram form, according to an embodiment of the invention. The system features a number of devices 108_1, 108_2, ... 108_N (108) all of which are coupled to a global free running clock line 118. There may be other devices in the system 100, including logic devices 120 ... 128 all of which are also coupled to the global clock line 118. Note that all references to a "device" in this disclosure are understood as referring to a logic unit in an IC die, a separate IC die, or a module containing a number of IC dies that may or may not be separately packaged. In the particular embodiment shown in FIG. 1, each device 108 is a memory device, either a memory IC die or a memory module that has a number of packaged memory IC dies. The invention is not limited to memory subsystems but rather may be used in a wide range of other types of digital logic systems including general purpose or specialized multi-processor systems. For conciseness, however, only the memory application will be described in this disclosure, although one of ordinary skill in the art recognizes that the general concepts may be applicable to a wide range of digital logic subsystems other than solid state memory.

The system 100 features a bus 112 to which each of the devices 108 are coupled. In the embodiment of FIG. 1, the bus 112 is a parallel bus, where each of the devices 108 is coupled to the same set of conductors (lines) that form the bus. This is also known as a multi-drop bus architecture. As a memory bus, the bus 112 allows a memory controller 104 to access a memory location by providing an address, content, and control signals to the devices 108. The controller 104 in turn acts as a logic interface between the devices 108 and other logic devices 120 ... 128 in the system 100. For instance, the system 100 may be a computer motherboard in which the controller 104 is a memory controller, and the bus 112 is a dedicated memory bus to which the devices 108 each being a solid state IC memory module are connected. The processor in such a system may be the logic device 120 which communicates with the controller 104 over a processor bus 116. The system 100 may, alternatively, be configured according to a wide range of other systems in which some type of a controller 104 is used to access a number of logic devices 108 that are synchronized with a global clock and receive a timing strobe for further synchronization and validation in each device.

The system 100 is equipped with a point-to-point strobe bus 114, having multiple segments 114_1, 114_2, . . . 114_N. The strobe bus segment 114_1 connects an output of the controller 104 to a strobe input of the logic device 108_1. The other segments of the bus 114, referred to as back segments, each connect an output of one logic device 108 to a strobe input of another adjacent logic device as shown. In such a configuration, each of the logic devices 108, except device 108_1, receives its input strobe from another logic device 108. This is in contrast to an alternative configuration (not shown) in which the strobe bus 114 between the controller and the logic devices 108 is in a hub and spoke configuration. In that embodiment, each segment of the point-to-point strobe bus connects a separate output of the controller 104 with a respective one of the logic devices 108.

An advantage of using the source synchronous strobe to further synchronize and validate each logic device 108 may be appreciated by considering the following example. Referring to FIG. 1, note how the global clockline 118 snakes its way across either a substrate or printed wiring board of the system 100, while feeding the logic devices 120 through 128, to arrive at the logic device 108_1. In contrast, note the relatively short distance of each segment of the strobe bus 114. Because of the shorter distance, the transmission line effects on the strobe signal are accordingly much less than those affecting the global clock signal. The accuracy of the strobe signal is further enhanced by virtue of the reduced capacitive loading on the point-to-point connections as compared to the global clock line 118 to which a large number of loads (logic devices) are directly connected. Thus, the timing accuracy associated with a pulse in the strobe signal is much higher than the timing accuracy of the global clock signal.

Figure 2:
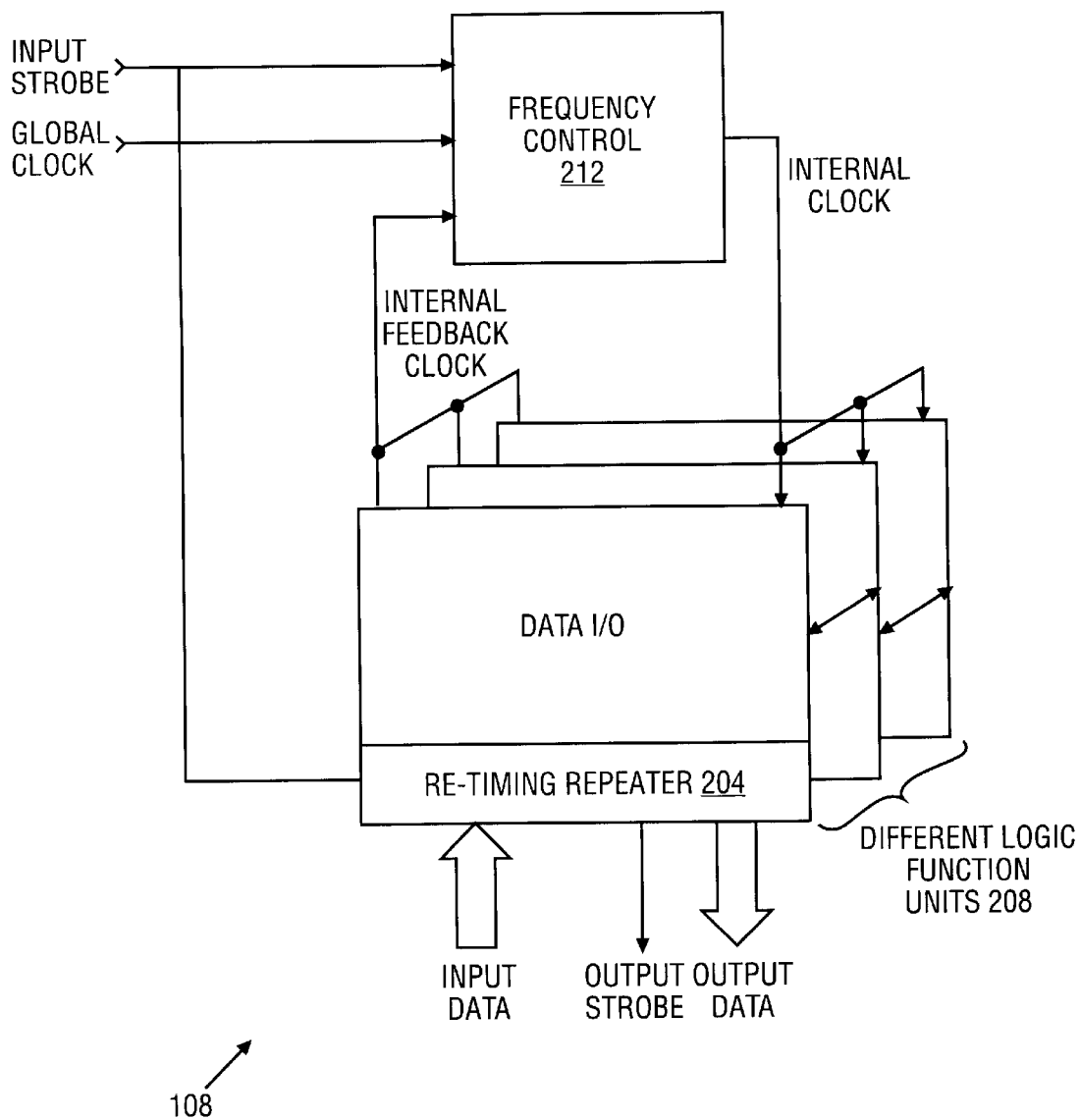
FIG. 2 depicts a block diagram of a portion of an integrated circuit (IC) device of the system in FIG. 1.

Turning now to FIG. 2, a block diagram of a portion of the device 108 is depicted. In particular, the components shown in FIG. 2 are formed on the same IC die. The components include a frequency control unit 212 which controls the average frequency of an internal free running clock signal to match that of an input global clock signal, received on the global clock line 118 (see FIG. 1). Furthermore, the frequency control unit 212 is to synchronize the internal clock to the input non-free running strobe. This is done by phase aligning the internal clock to the input strobe, by detecting the phase difference between an internal feedback clock and the input strobe. Such phase alignment may be based upon a conventional phase locked loop (PLL) or other suitable frequency control technique implemented within the frequency control unit 212.

The internal clock is fed to each of a number of different logic function units 208. Each function unit 208 is to perform a different logic function, as synchronized by the internal clock. At least one of the logic function units 208 is responsible for data I/O to the device 108. The data I/O unit repeatedly generates one or more bits from an input data signal, for use by the other logic function units 208 in the device 108. According to an embodiment of the invention, these bits are deemed valid only if their generation by the data I/O unit is validated by the input strobe. For instance, after the input data has been latched, the latched data is deemed valid if, within a predetermined interval thereafter, a falling edge of the input strobe is also detected.

The different logic function units 208 may, according to the type of device 108, perform a wide range of different functions. For instance, if a device 108 is a memory I/C die, then at least one of the logic function units 208 is a digital memory storage array. As another example, if the device 108 is part of a memory controller, then one of the logic function units 208 is to perform a virtual to physical address translation upon a virtual memory address that is carried by the input data signal.

Referring back to FIG. 1, in those embodiments of the invention such as the one illustrated here in which the point-to-point strobe bus 114 has a number of back segments 114_2, 114_3, . . . 114_N, each logic device 108 is to relay or repeat the input data and generate an output strobe signal which are fed to the data and strobe inputs of a neighboring logic device. This output strobe signal may be "non-free running" in that it would be asserted only when one or more bits of output data are being driven by the transmitting logic device. As an alternative, the output strobe may be free-running, such that the output data is asserted only in accordance with predefined transitions in the output strobe. In both cases, pulses in the output strobe are synchronized with the one or more bits of output data that are being driven into the bus 112. To achieve such functionality, now referring to FIG. 2, the data I/O function unit in each device 108 further includes a repeater 204 to re-time the input data in sync with the output strobe, and then drive the output data and strobe into the bus 112 and the next segment of the point-to-point strobe bus 114. The repeater 204 is able to synchronize the output data and the output strobe signal, such as in the manner described below in connection with FIGS. 5–11.

Figure 3:
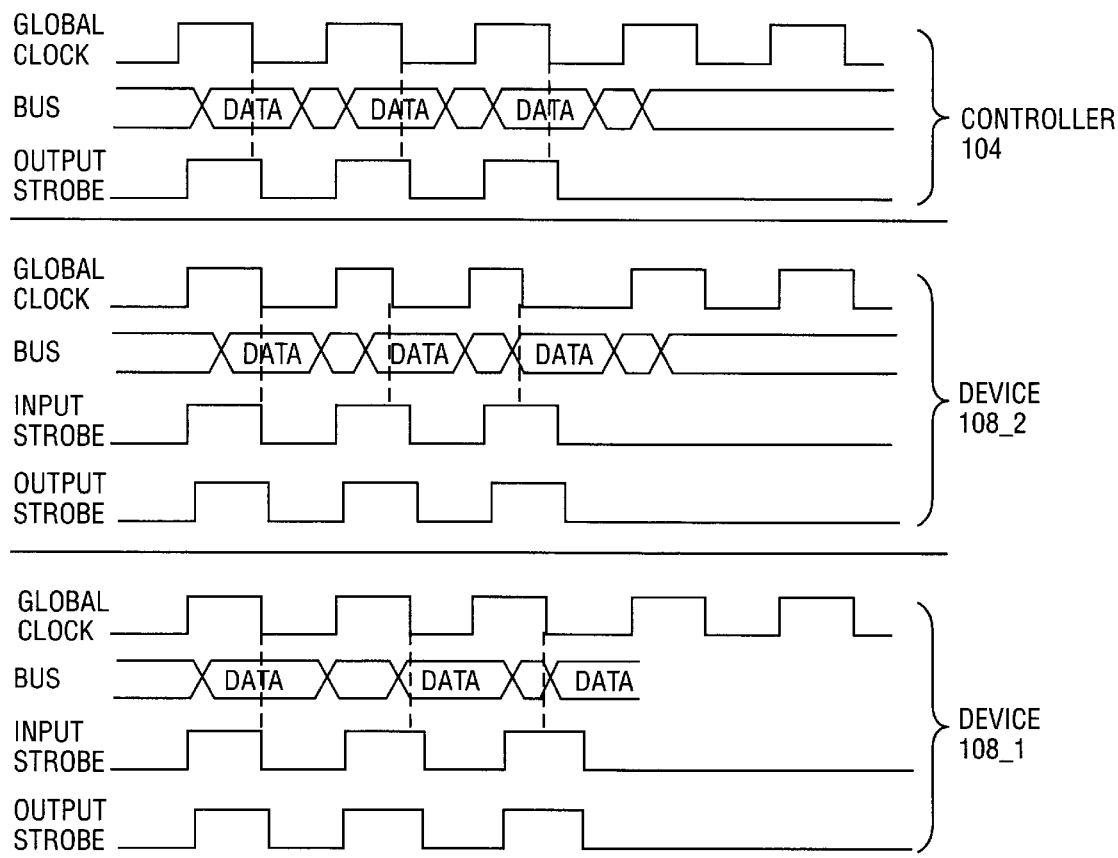
FIG. 3 illustrates an exemplary timing diagram for a process performed in the system of FIG. 1.

Turning now to FIG. 3, an exemplary timing diagram for a process performed in the system of FIG. 1 is illustrated. Three sets of waveforms are shown and which represent input and output signals for the controller 104, device 108_1, and device 108_2. Although this example is limited to only two devices that are coupled to the controller, the general concepts are applicable to a system having more than two devices.

Each set of timing diagrams includes a GLOBAL CLOCK waveform which represents the global clock signals as measured at an input to the controller or a device of the set, as the case may be. Note how the sequence of pulses in the GLOBAL CLOCK of device 108_1 and device 108_2 are time shifted, that is delayed, with respect to the pulses in the GLOBAL CLOCK received by the controller 104. This is a result of transmission line effects or other non-idealities in the system 100. In addition, note how each successive period in the GLOBAL CLOCK is not necessarily the same, where such inconsistent behavior in the period is referred to as cycle-to-cycle jitter.

Each set of timing diagrams also includes a BUS waveform which shows three sets of data words, where each word is defined as one or more bits. The data words are those that are transmitted by the controller 104 and received by the devices 108_1 and 108_2.

Finally, each set of timing diagrams also has an OUTPUT STROBE waveform which represents, in this example, a driven non-free running output strobe. In addition, the set of timing diagrams for the devices 108_1 and 108_2 also have an INPUT STROBE waveform, which represents an input non-free running strobe signal received at the respective device.

Referring first to the set of timing diagrams of controller 104, note how each set of data words is generated in a substantially fixed timing relationship with respect to each rising edge of OUTPUT STROBE. In this way, any cycle-to-cycle jitter in the received global clock is not reflected in the output data that is sent to the devices 108__1 and 108__2.

Moving now to the set of timing diagrams for device 108__1, the first and second falling edges in GLOBAL CLOCK essentially coincide with the first and second falling edges of INPUT STROBE. However, the third falling edge of GLOBAL CLOCK is dangerously close to "missing" the third data word. Accordingly, the advantage of using the strobe signal becomes apparent here because the falling edge of the third pulse in INPUT STROBE is well within the third data interval. Thus, rather than use the global clock to validate the capture of the data, the device 108__1 uses the input strobe as a mechanism for validating the capture of input data. This is because the input strobe has a much more precise timing characteristic, that is one that more closely matches that of the output strobe generated by the controller 104. In contrast, the jitter present in the received global clock at the device 108__1 is significant in comparison to the global clock received at the controller 104.

Returning to FIG. 3, the final set of timing diagrams is for device 108__2. Once again, the transmission line effects and/or cycle-to-cycle jitter in GLOBAL CLOCK as received by the device 108__2 renders the use of this signal unacceptable for validating the capture of the input data, particularly as exhibited by the third falling edge coinciding with just barely the start of the third input data word. Again, INPUT STROBE provides a much more reliable edge for use in capturing the input data, because this signal is received from the device 108__1 over a well controlled, high timing accuracy, point-to-point bus, as compared to the meandering and heavily loaded global clock line 118 (see FIG. 1).

Figure 4:
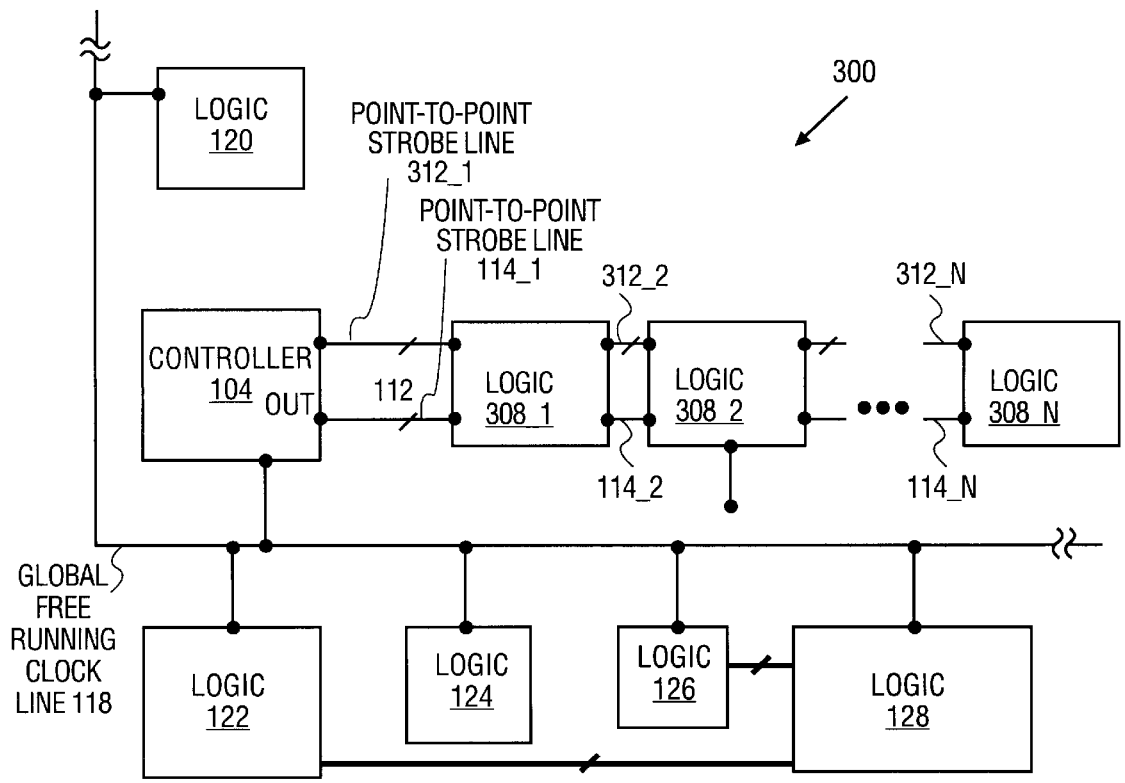
FIG. 4 shows a block diagram of an electronic system according to another embodiment of the invention.

Turning now to FIG. 4, what's shown is another embodiment of the invention, namely a system 300 in which a controller 304 is coupled to a number of logic devices 308__1, 308__2, . . . 308__N via a point-to-point bus 312, rather than a parallel bus as in FIG. 1. One application of such a system is in a memory subsystem, where the point-to-point bus 312 is a memory bus in which memory content, address, and control bits are passed between the controller and the various devices in a relay-type manner. Operation of such a system, particularly the interaction between the controller 304 and the logic devices 308, is similar to the system 100 of FIG. 1, except that the controller 304 and the logic devices 308 are designed to interact with each other using a point-to-point bus 312, rather than a multi-drop bus. Thus, for instance, if the controller 304 wishes to access a memory location in the device 308__2, the logic device 308__1 will act as a bridge or a repeater between the controller 304 and device 308__2, to relay the access request. In addition, the device 308__1 will generate a strobe signal on the segment 114__2 of the strobe bus 114, to help reduce cycle-to-cycle jitter that would otherwise manifest itself within the device 308__2 and that would perhaps affect the proper capture of the access request that is being relayed from the controller 304.

In those embodiments where the strobe signal is not free running, i.e. asserted only when there is significant data being driven on the bus between the devices, the signal may nevertheless be locally periodic during bursts of data transfer.

In the various embodiments of the invention described above, any references to a strobe bus are understood as covering a bus having any one of various signaling alternatives including single ended, pseudo-differential and differential signaling. Thus, for the single ended version, the strobe signal on a single conductor line would be measured relative to a ground plane, whereas in the differential case there would be a second line (not shown) which would be used to measure the differential strobe signal.

In addition, although the description above is of a unidirectional scheme in which data is transmitted from the controller to the logic devices, one of ordinary skill in the art will recognize that the same description also applies, in the reverse direction, for a bidirectional scheme in which the logic devices transmit back to the controller. The backwards transmissions could contain memory content that was requested to be read, an acknowledgment or a retry, or other command that is directed to the controller. To implement a bi-directional scheme, there could be, for instance, a second strobe bus essentially similar to the ones shown and described above which carries a strobe signal in the reverse direction. As an alternative to the separate strobe buses, the single conductor line shown and described above may be used for a simultaneous bidirectional strobe signal. This simultaneous bidirectional alternative may also be used for the multi-drop or point-to-point data bus that connects the controller and the logic devices.

Repeater Design

Figure 5:
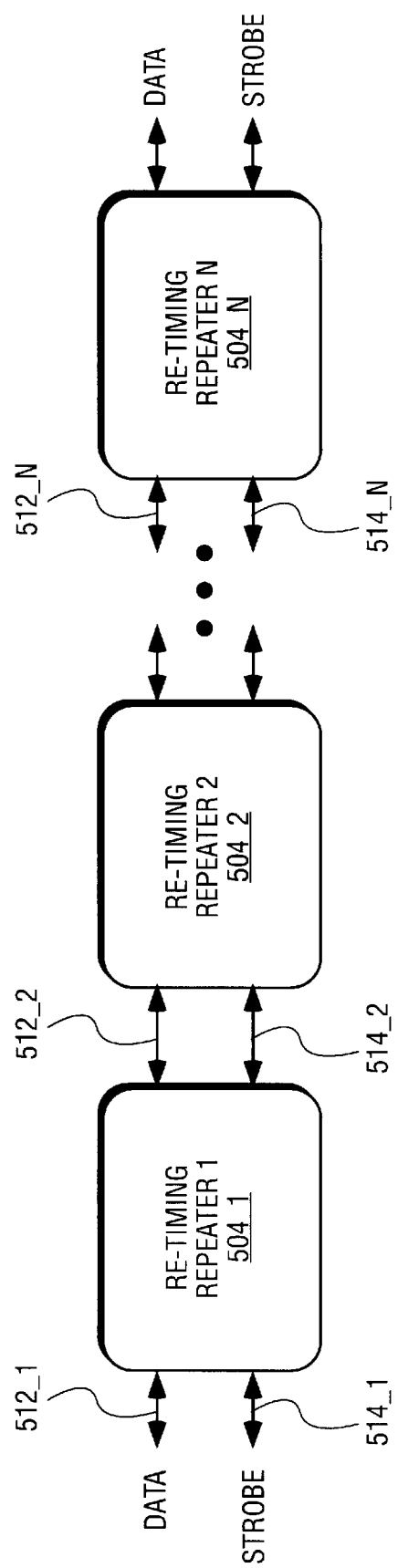
FIG. 5 illustrates a chain of repeaters each to re-time input data with respect to an input source synchronous strobe.

For those embodiments which use a point-to-point data bus and a point-to-point strobe bus, a repeater circuit which is able to relay digital data, while re-timing the data with respect to an input strobe, is needed. Turning now to FIG. 5, a block diagram of a re-timing repeater chain is shown. Each repeater 504 may be part of a separate logic device, where a device may be an integrated circuit (IC) die or separate IC package. Each repeater 504 receives input data along one or more conductor lines of a data bus 512, and an input strobe signal on a single conductor line bus 514. The strobe and the data had been transmitted together in the sense that there is a precise and fixed timing relationship between the strobe and certain data words in the input data. In certain applications, it is expected that the strobe signal is locally periodic. This local periodicity would be caused by association of the strobe signal with a number of equispaced data words received in the input data signal. In other embodiments, the strobe signal is free-running.

The input data is re-timed with respect to the input strobe by a repeater, and then both are retransmitted to the next repeater in the chain. In certain embodiments, this re-timed repeating function may be performed for data and strobe information traveling in both directions simultaneously on the same strobe and data lines. This is referred to as the simultaneous bi-directional (SBD) embodiment of the invention.

Figure 6:
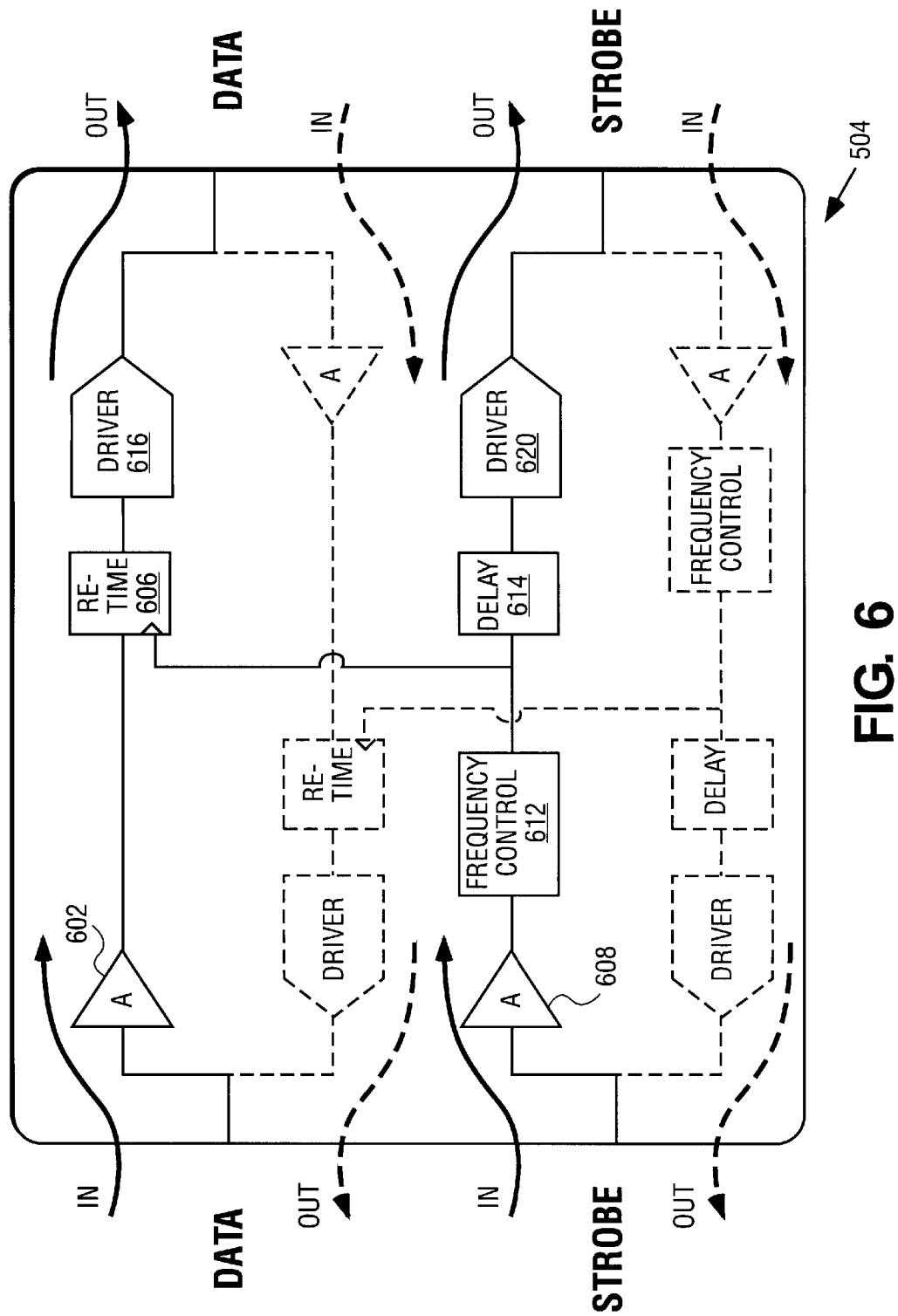
FIG. 6 depicts a block diagram of a repeater that uses a phase locked loop to produce a re-timing clock for the re-timing of the data.

Turning now to FIG. 6, a block diagram of a repeater circuit 504 according to an embodiment of the invention is illustrated. The circuit 504 is designed to handle data on just one conductor line of each connecting segment of the data bus 512. To handle each additional data bit in parallel, the components of the data path in the repeater 504 could be duplicated. The data and strobe are said to flow in a downstream direction if they are received on the left hand side and forwarded through the right hand side ports. For the SBD embodiment, the same data and strobe conductors are used to receive and forward both downstream and upstream data and strobe information. The components needed to implement the SBD embodiment are shown in dotted lines and may be essentially identical to the components of, and have the same functionality (described below) as, the uniadirectional (downstream) embodiment.

Beginning with the data path, the input data is buffered by an amplifier 602 before being fed to the data input of a downstream latch 606. For the SBD embodiment, the buffer 602 is capable of extracting a digital downstream data signal from the same conductor on which an upstream data signal is driven simultaneously. The downstream latch 606 also has a clock input that is coupled to the output of a frequency control unit 612. This control unit 612 has an input to receive a digtal downstream strobe signal that has been buffered by an amplifier 608. The frequency control unit 612 has an output to provide a controlled delay to the input strobe signal. This controlled delay is designed to be essentially equal to a setup time of the downstream latch 606. The output of the frequency control unit 612 is further coupled to a delay element 614, where the delay element is to further delay the downstream strobe signal by essentially a propagation time of the downstream latch 606. The outputs of the latch 606 and the delay element 614 feed respective drivers 616 and 620 whose outputs are in turn connected to separate conductors being the data and strobe ports. Once again, for the SBD embodiment, the driver 616 and 620 would be further designed to recognize the actual signal levels needed for simultaneous bi-directional signaling on their respective conductor lines.

Figure 7:
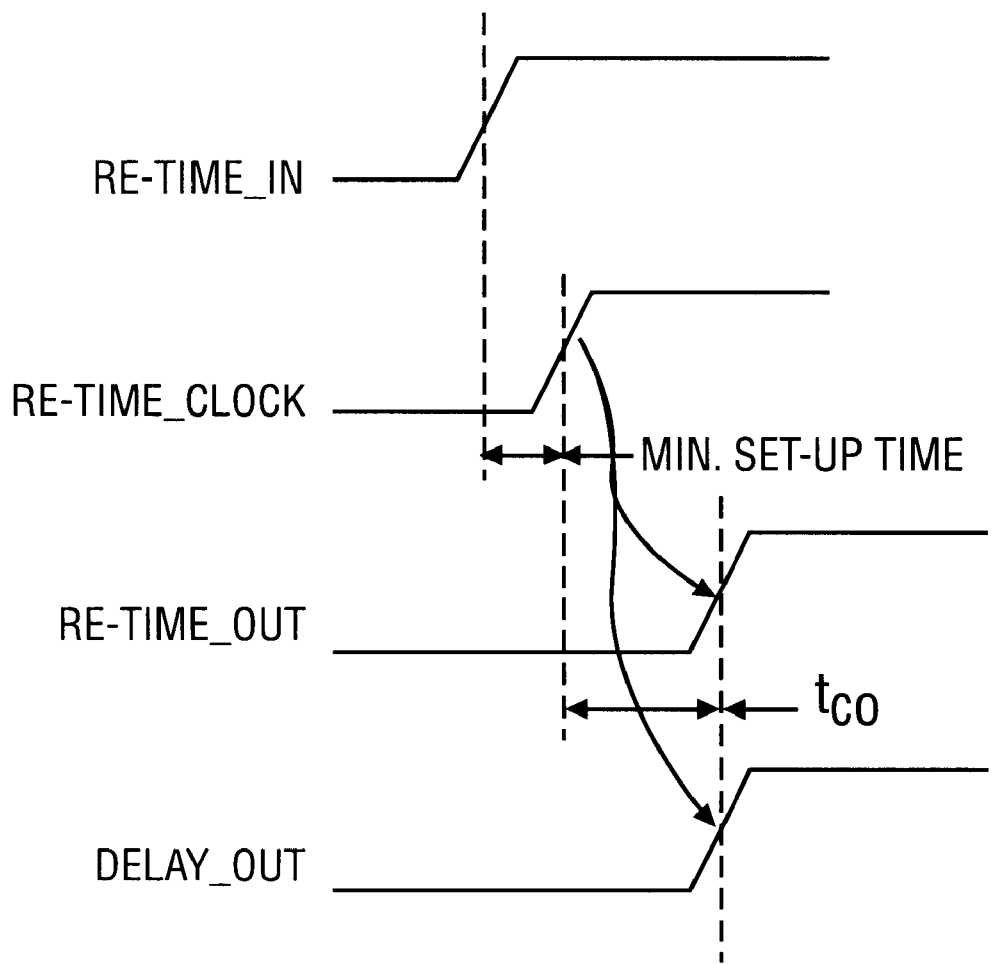
FIG. 7 shows a timing diagram of some of the signals in the repeater of FIG. 6.

FIG. 7 shows a timing diagram of some of the signals that appear in the repeater circuit 504 of FIG. 6. The re-time_in waveform would, in th e embodiment of FIG. 6, be the downstream data signal that is fed to the data input of latch 606. Note how the re-time_clock waveform has to meet a minimum setup time following a transition in the re-time_ in. The output of the latch 606 is depicted by the re-time_ out waveform which shows a delay with respect to the rising edge of re-time-clock that is defined as the clock output transition, $t_{co}$. The delay provided by the delay circuit 614 is thus essentially $t_{co}$, as seen by t he delay_out waveform of FIG. 7. Thus, the low to high transitions in re-time_out and delay_out are essentially aligned, which means that the downstream data and strobe signals that are driven by drivers 616 and 620 are synchronized.

Thus, a method for relaying digital data may be described as follows. A digital downstream strobe signal is delayed by essentially a set up time of a downstream latch. This delay is done under closed loop control to limit any latched data signal and an output strobe signal, which are now essentially phase aligned.

The introduction of cycle-to-cycle jitter into the output strobe signal may be rejected by the repeater circuit 604 by using a phase locked loop (PLL) arrangement in the frequency control unit 612. The advantage of using a PLL for re-timing is the rejection of cycle-to-cycle strobe jitter at each repeater in the chain. However, the PLL may exhibit some power supply sensitivity, which may result in frequency steps caused by supply noise. Accordingly, care should be taken to ensure that large phase errors in the PLL output do not appear.

Figure 8:
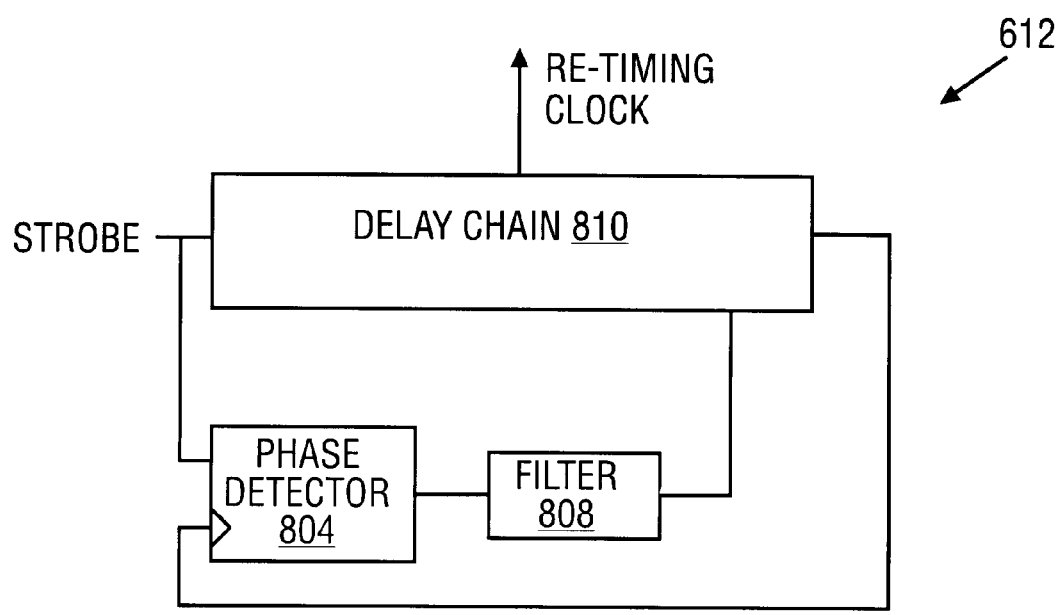
FIG. 8 depicts a block diagram of a delay locked loop used for generating the re-timing clock.

An alternative to using a PLL is the use of a delay locked loop (DLL). An example of a frequency control unit 612 that is based on a DLL arrangement is shown in FIG. 8. The advantage to using a DLL to generate the re-timing clock is that the systematic frequency offsets that result from supply noise/variation in low bandwidth PLLs are avoided. However, it is possible that cycle-to-cycle strobe jitter may accumulate from repeater to repeater, because the DLL tends to pass jitter straight through. Referring to FIG. 8, the DLL version of the frequency control unit 612 includes a delay chain 810 which receives the input strobe signal and allows the re-timing clock to be extracted from somewhere in the delay chain 810. An output of the delay chain 810 is fed back to one input of a phase detector (PD) 804. The strobe input is the other signal into the phase detector 804. The output of the phase detector 804 is a sequence of pulses which are filtered by a filter 808, such that a slower varying control signal is provided to adjust the total delay in the delay chain 810. Thus, the delay is automatically adjusted so that the strobe input and the re-timing clock are essentially phase aligned. Any variation presented by the delay chain 810 that may be caused by power supply noise is automatically compensated for after being detected by the phase detector 804.

The above described process of operation and exemplary circuitry of the repeater 604 may be duplicated in each of a number of logic devices whose repeaters are coupled to each other as links in a chain, as shown in FIG. 5. Information may thus be transmitted in the downstream data, from left to right. In addition, in the SBD embodiment shown by dotted lines in FIG. 6, the repeater chain will perform in the reverse direction, such that upstream information is transmitted from right to left. This may be done by essentially the same process and circuitry described above which is duplicated in the upstream direction.

Figure 9:
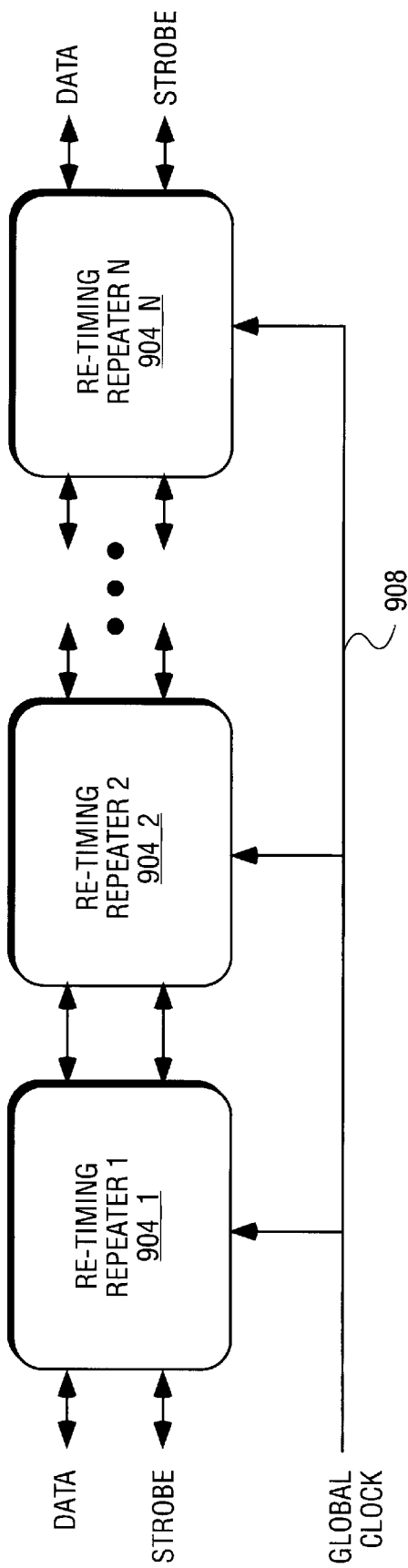
FIG. 9 shows a block diagram of a chain of repeaters that use a source synchronous strobe and a low-jitter global clock to re-time and repeat input data.

Turning now to FIG. 9, another embodiment of the invention is illustrated in block diagram form, as a chain of repeaters 904_1, 904_2, ... 904_N (904) that use a global free-running clock received by each repeater on the same global clock line 908. An alternative way to distribute the global clock, other than the multi-drop trace shown in FIG. 9, in which a short stub is placed between the main trace and the input to each repeater 904, would be a hub and spoke configuration where a dedicated clock trace is provided between a global clock source (not shown) and each repeater 904. This global clock is then phase aligned at each repeater to the input strobe. This phase aligned global clock is then used to re-time the data that is forwarded by each repeater. Since all other cascaded repeaters in the chain may perform these same functions, the data results in being passed down along the chain as far as necessary. As mentioned above, in the SBD embodiment, this re-timing and repeating function is performed for both data and strobe travelling in both directions simultaneously, on the same strobe and data conductors.

Figure 10:
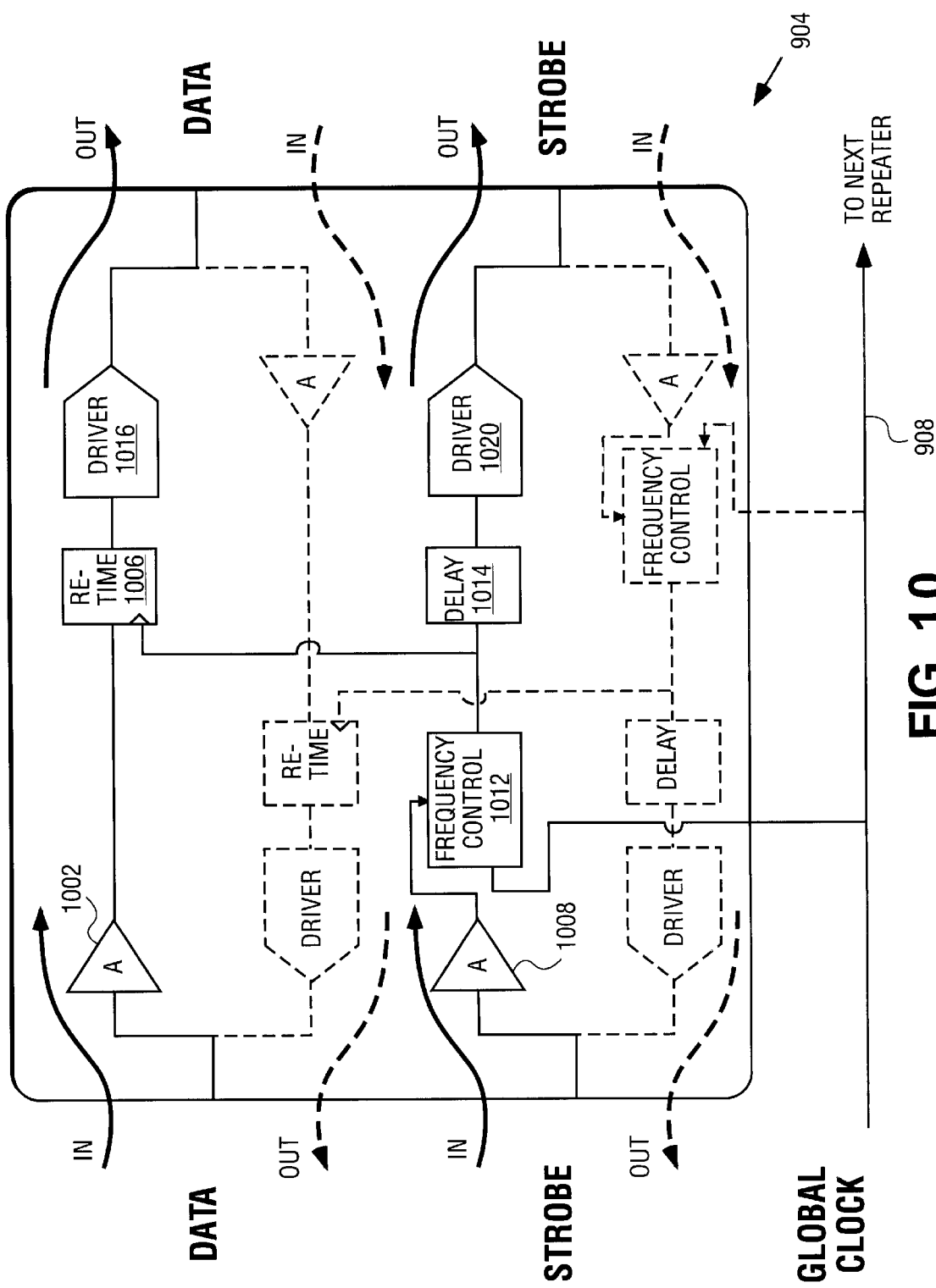
FIG. 10 illustrates a block diagram of a repeater that uses a frequency control unit to align the global clock to the input source synchronous strobe, to produce the re-timing clock.

Referring now to FIG. 10, a block diagram showing greater detail of an embodiment of the repeater 904 is illustrated. The components and operation in this repeater 904 are essentially similar to those of the repeater 504 (See FIG. 6), except in the manner in which the re-timing clock (that is input to a downstream latch 1006) is obtained. In this embodiment, the input strobe signal received from the amplifier 1002 is phase aligned to a delayed version of the global clock obtained from the global clock line 908. It is this delayed and phase aligned global clock signal which is then used to clock the downstream latch 1006. An advantage to generating the re-timing clock in this manner, as compared to the embodiment of FIG. 6 in which only the input strobe is used to obtain the re-timing clock, is that it enables the use of a DLL for re-timing, which is a simpler circuit than a PLL, while preventing the accumulation of jitter from repeater to repeater. A further advantage is that the re-timing clock is an aligned global clock signal that may also be used as a low-jitter clock for the rest of the logic function units of the logic device in which the repeater 904 is located.

In the SBD embodiment of the repeater 904, a number of operations analogous to those described for the downstream direction can be performed simultaneously on data and strobe signals in the upstream direction. The components needed for such an embodiment are illustrated in dotted lines in FIG. 10.

Figure 11:
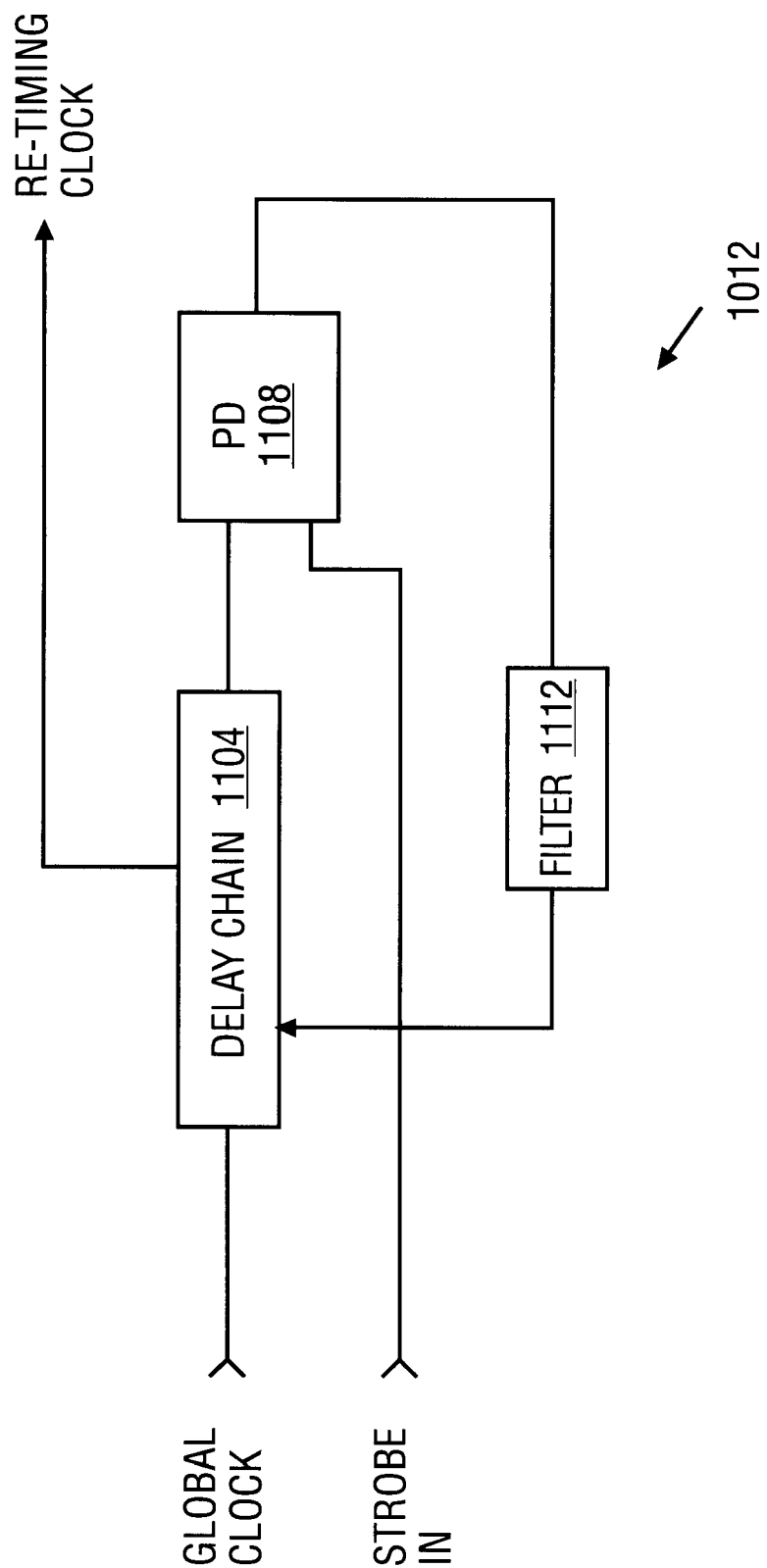
FIG. 11 illustrates a block diagram of a delay locked loop as part of the frequency control unit of FIG. 10.

In the repeater 904, the phase alignment by the frequency control unit 1012 may be based upon either a PLL or a DLL arrangement. FIG. 11 shows a DLL-based arrangement in which the global clock is fed to a delay chain 1104. The delay chain 1104 is tapped to obtain the re-timing clock, and also provides the input to a phase detector (PD) 1108. The other input to the phase detector is the input strobe. The output of the phase detector 1108 is then fed through a filter 1112 which then controls the amount of delay that is presented to the input global clock. In this manner, corresponding transitions in the re-timing clock and the input strobe are aligned, by varying the delay that is presented to the input global clock.

The use of a global clock in the repeater 904 may help to virtually eliminate the cumulative jitter in the strobe signal that is received by each repeater when a DLL based version of the frequency control unit 1012 is being used. Thus, with cumulative jitter in the data and strobe information removed, the chain of repeaters can operate at a higher data rate and with a larger number of linked logic devices.

As mentioned earlier, an application of the repeaters described above is a dynamic random access memory (DRAM) interface. In such an application, a chain of DRAM chips or DRAM modules can be constructed by incorporating a repeater into each chip or module, to allow for increased data rate of the DRAM interface. Such an architecture makes a DRAM array more scalable in size and speed.

To summarize, various embodiments of the invention have been described that are directed to the use of a timing strobe separate from a global clock, to improve the immunity to cycle jitter present in the global clock. In the foregoing specification, the invention has been described with reference to specific exemplary embodiments thereof. It will, however, be evident that various modifications and changes may be made thereto without departing from the broader spirit and scope of the invention as set forth in the appended claims. For instance, the various embodiments of the re-timing repeater architecture described above may also be used between devices in a microprocessor chip set, as well as any other situation that requires a digital I/O circuit. Among the many signaling schemes that can be used is the well known gunning transceiver logic (GTL) technique. The specification and drawings are, accordingly, to be regarded in an illustrative rather than a restrictive sense.

What is claimed is:

1. A method comprising:
   generating, by a first logic device within a digital electronic system having a second logic device, a free-running on-chip clock signal, the signal having a frequency that is controlled to match that of a global clock signal received by the first and second devices;
   synchronizing the free-running on-chip clock signal to a strobe signal received by the first device and that was transmitted in association with a data signal by the second device; and
   repeatedly performing a logic function, as synchronized by the on-chip clock signal, to repeatedly generate one or more bits from the data signal.

2. The method of claim 1 further comprising:
   repeatedly driving the one or more bits into a bus as synchronized with an output strobe signal, wherein the output strobe signal is asserted only when one or more bits are being driven into the bus and are synchronized with the output strobe signal.

3. The method of claim 1 wherein the data signal carries a virtual memory address, the logic function is a virtual to physical address translation, and the one or more bits are part of a physical address in solid state memory.

4. The method of claim 1 wherein the strobe signal received by the first device is free-running.

5. A method comprising:
   generating, by a logic device within a digital electronic system, a free running on-chip clock signal, the signal having a frequency that is controlled to match that of a global free running clock signal in the system; and
   transmitting, by the device, (1) a data signal synchronized with the on-chip clock signal, and (2) a strobe signal phase aligned with the data signal.

6. The method of claim 5 wherein the data signal carries a virtual memory address.

7. The method of claim 5 wherein the strobe signal contains a plurality of pulses each of which is aligned with the start of a plurality of data words in the data signal.

8. The method of claim 5 wherein the strobe signal is free-running.

9. An integrated circuit (IC) die comprising:
   a frequency control circuit to control a frequency of an internal free running clock signal to match that of an input global free-running clock signal, and to synchronize the internal clock signal to an input strobe signal; and
   a plurality of logic function units each to perform a different logic function, as synchronized by the internal clock signal, at least one of the units to repeatedly generate one or more bits from an input data signal.

10. The IC die of claim 9 further comprising:
    repeater circuitry to repeatedly drive the one or more bits into a bus, as synchronized with an output strobe signal.

11. The IC die of claim 10 wherein the output strobe signal is asserted only when one or more bits are being driven into the bus and are synchronized with the output strobe signal.

12. The IC die of claim 9 wherein one of the plurality of logic function units is a digital memory storage array.

13. The IC die of claim 9 wherein one of the plurality of logic function units is to perform a virtual to physical address translation upon a virtual memory address carried by the data signal.

14. An electronic system comprising:
    a plurality of logic devices;
    a bus to which each of the plurality of logic devices are coupled;
    a strobe bus to which each of the plurality logic devices are coupled; and
    a controller coupled to the bus to access each of the plurality of logic devices, each of the logic devices and the controller having a frequency control unit to control a frequency of an internal free running clock signal to match that of an input global free-running clock signal of the system,
    the frequency control unit in each of the logic devices to further synchronize the internal clock signal to an input strobe signal from the strobe bus, and wherein input data is captured by each of the logic devices in sync with the input strobe signal.

15. The electronic system of claim 14 wherein the bus is a parallel bus, each of the plurality of logic devices is coupled to the same set of conductors that form the bus.

16. The electronic system of claim 14 wherein the bus is a point to point bus having a front segment and a plurality of back segments, each back segment to connect a pair of the logic devices, the front segment to connect the controller to one of the logic devices.

17. The electronic system of claim 14 wherein the strobe bus is a point to point bus having a front segment and plurality of back segments, each back segment to connect a pair of the logic devices, the front segment to connect the controller to one of the logic devices.

18. The electronic system of claim 14 wherein the strobe bus is a point to point bus having a plurality of segments, each segment to connect the controller with a respective one of the plurality of logic devices.

19. The electronic system of claim 14 wherein each of the plurality of devices is a solid state IC memory package, and the controller is a memory controller.

20. The electronic system of claim 19 wherein each of the plurality of devices is a solid state IC memory module.

21. The electronic system of claim 14 wherein at least one of the logic devices further includes a repeater to forward the input data onto the bus as synchronized with an output strobe signal.

22. The electronic system of claim 21 wherein the repeater provides the output strobe signal as a free-running signal.

* * * * *

UNITED STATES PATENT AND TRADEMARK OFFICE
CERTIFICATE OF CORRECTION

PATENT NO. : 6,437,601 B1
DATED : August 20, 2002
INVENTOR(S) : Borkar et al.

It is certified that error appears in the above-identified patent and that said Letters Patent is hereby corrected as shown below:

Column 7,
Line 46, before "latched data", insert -- variation in the delay that may be caused by variations in the manufacturing process or the operating temperature. The latch is used to capture the value of a digital downstream data signal, in accordance with the delayed downstream strobe signal. The delayed downstream strobe is further delayed by essentially a propagation time of the latch. This allows separate drivers to drive the --.

Signed and Sealed this

Twenty-fourth Day of June, 2003

JAMES E. ROGAN
*Director of the United States Patent and Trademark Office*